(12) United States Patent
Marc et al.

(10) Patent No.: US 8,009,995 B2
(45) Date of Patent: Aug. 30, 2011

(54) METHOD AND APPARATUS FOR PHOTONIC DIGITAL-TO-ANALOG CONVERSION

(75) Inventors: Currie Marc, Gaithersburg, MD (US); Lou W. Janet, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 1024 days.

(21) Appl. No.: 11/535,724

(22) Filed: Sep. 27, 2006

(65) Prior Publication Data
US 2007/0159369 A1    Jul. 12, 2007

Related U.S. Application Data

(60) Provisional application No. 60/762,211, filed on Jan. 12, 2006.

(51) Int. Cl.
*H04B 10/04* (2006.01)

(52) U.S. Cl. ............ 398/183; 398/79; 398/82; 398/141; 398/158; 398/159; 398/188; 398/154; 398/155; 341/137; 341/144; 359/326; 359/332; 359/245

(58) Field of Classification Search .................. 398/182, 398/183, 184, 186, 188, 187, 189, 190, 191, 398/192, 194, 202, 207, 212, 208, 140, 141, 398/79, 82, 154, 155, 158, 159, 161; 341/137, 341/144, 155, 122, 159; 359/326, 332, 245
See application file for complete search history.

(56) References Cited

U.S. PATENT DOCUMENTS

| | | | |
|---|---|---|---|
| 5,039,988 A * | 8/1991 | Hong | 341/137 |
| 6,313,932 B1 * | 11/2001 | Roberts et al. | 398/9 |
| 6,525,682 B2 * | 2/2003 | Yap et al. | 341/137 |
| 7,061,414 B2 * | 6/2006 | Chen et al. | 341/137 |
| 7,292,792 B2 * | 11/2007 | Chen et al. | 398/183 |
| 7,403,711 B2 * | 7/2008 | Chen et al. | 398/45 |
| 2002/0176144 A1 * | 11/2002 | Bergano et al. | 359/192 |
| 2003/0202794 A1 | 10/2003 | Izadpanah et al. | |
| 2005/0041974 A1 * | 2/2005 | Novak et al. | 398/81 |
| 2005/0168364 A1 * | 8/2005 | Chen et al. | 341/137 |
| 2005/0238367 A1 * | 10/2005 | Chen et al. | 398/188 |
| 2007/0159370 A1 * | 7/2007 | Baginski et al. | 341/144 |

OTHER PUBLICATIONS

Currie, M., "Optical quantization of microwave signals via distributed phase Modulation." J. Lightwave Technol., 23, pp. 827-833, 2005.

Currie, M., Hybrid photonic analog-to-digital conversion using superconducting electronics, IEEE Trans. Appl. Supercond., 14, pp. 2047-2052, 2004.

Juodawlkis, P. W., Twichell, J. C., Betts, G. E., Hargreaves, J. J., Younger, R. D., Wasserman, J. L., O'Donnell, F. J., Ray. K. G., and Williamson, R. C., "Optically sampled analog-to-digital converters," IEEE Trans, Microwave Theory and Techniques, 49, pp. 1840-1853, 2001.

Saida, T., Okamoto, K., Uchiyama, K., Takiguchi, K., Shibata, T., and Sugita, A., "Integrated optical digital-to-analogue converter and its application to pulse pattern recognition," Electron. Lett., 37, pp. 1237-1238, 2001.

Yacoubian, A. and Das, P. K., "Digital-to-analog conversion using electrooptic modulators," IEEE Photon. Technol. Lett., 15, pp. 117-119, 203.

Lou, J. W., Carruthers, T. F., and Currie, M., "4* 10 GHz mode-locked multiple-wavelength fiber laser." IEEE Photon. Technol. Lett., 16, pp. 51-53, 2004.

* cited by examiner

*Primary Examiner* — Hanh Phan
(74) *Attorney, Agent, or Firm* — Amy Ressing; Suresh Koshy

(57) ABSTRACT

A method and apparatus for receiving a digital signal having a plurality of significant bits of resolution. The apparatus includes a mode locked laser comprising a single output. The apparatus also includes a beam divider operable to receive the single output. The apparatus also includes a plurality of optical modulators operable to communicate with said beam divider and operable to receive a respective plurality of signals corresponding to a plurality of significant bits of resolution. Optionally, the apparatus also includes a source operable to output a digital waveform with the plurality of signals corresponding to the plurality of significant bits of resolution of the digital waveform, the plurality of signals operable to drive the plurality of optical modulators.

8 Claims, 6 Drawing Sheets

METHOD AND APPARATUS FOR PHOTONIC DIGITAL-TO-ANALOG CONVERSION

CROSS-REFERENCE TO RELATED APPLICATION

This application claims priority to U.S. Provisional Patent Application Ser. No. 60/762,211, filed Jan. 12, 2006 entitled "WEIGHT, SUMMING PHOTONIC DIGITAL-TO-ANALOG CONVERSION." to Currie et al.

TECHNICAL FIELD

This invention relates, in general, to a method and apparatus for digital-to-analog conversion, and more particularly, to a method and apparatus for photonic digital to analog conversion.

DESCRIPTION OF RELATED ART

Conventional electronic digital-to-analog converters (DACs) have a maximum conversion rate of ~1 Gigasample per second (GSPS) with a resolution <8 bits. In order to produce arbitrary waveforms at microwave frequencies higher data conversion rates are needed. Combining photonic processing with high-speed electronics has demonstrated potential for converting higher-speed analog signals than purely electronic systems. See, e.g., Currie, M., 'Optical quantization of microwave signals via distributed phase Modulation,' J. Lightwave Technol., 23, pp. 827-833, 2005, incorporated herein by reference: Currie, M., 'Hybrid photonic analog-to-digital conversion using superconducting electronics.' IEEE Trans. Appl. Supercond., 14, pp. 2047-2052, 2004, incorporated herein by reference; and Juodawlkis, P. W., Twitchell, J. C., Betts, G. E., Hargreaves, J. J., Younger, R. D., Wasserman, J. L., O'Donnell, F., J., Ray, K. G., and Williamson, R. C., 'Optically sampled analog-to-digital converters,' IEEE Trans. Microwave Theory and Techniques, 49, pp. 1840-1853, 2001, incorporated herein by reference. Recently, implementation of photonic technology in DACs has shown promising results towards increasing the operating speed of DACs as well. See, e.g., Saida, T., Okamoto, K., Uchiyama, K., Takiguchi, K., Shibata, T., and Sugita, A., 'Integrated optical digital-to-analogue converter and its application to pulse pattern recognition.' Electron. Lett., 37, pp. 1237-1238, 2001, incorporated herein by reference; and Yacoubian, A. and Das, P. K., 'Digital-to-analog conversion using electrooptic modulators,' IEEE Photon. Technol. Lett., 15, pp. 117-119, 2003, incorporated herein by reference.

SUMMARY OF THE INVENTION

An embodiment of the invention includes an apparatus receiving a digital signal having a plurality of significant bits of resolution. The apparatus includes a mode locked laser comprising a single output. It also includes a beam divider operable to receive the single output. The apparatus also includes a plurality of optical modulators operable to communicate with the beam divider and operable to receive a respective plurality of signals corresponding to a plurality of significant bits of resolution. Optionally, the apparatus further includes a source operable to output a digital waveform with the plurality of signals corresponding to the plurality of significant bits of resolution of the digital waveform, the plurality of signals operable to drive the plurality of optical modulators. Optionally, the apparatus further includes a beam combiner operable to communicate with the plurality of optical modulators. Optionally, the apparatus further includes a photodetector operable to communicate with the beam combiner. Optionally, the apparatus further includes a low pass filter operable to communicate with the photodetector. Optionally, the apparatus further includes a band pass filter operable to communicate with said beam combiner. Optionally, the apparatus further includes a photodetector operable to communicate with the band pass filter. Optionally, the apparatus further includes a plurality of photodetectors operable to communicate with the plurality of optical modulators. Optionally, the apparatus further includes a combiner operable to communicate with the plurality of photodetectors. Optionally, the apparatus further includes a low pass filter operable to communicate with said combiner.

Another embodiment of the invention includes an apparatus receiving a digital signal having a plurality of significant bits of resolution. The apparatus includes a plurality of optical modulators. The apparatus also includes a digital waveform source operable to output a plurality of signals corresponding to the plurality of significant bits of resolution, the plurality of signals operable to drive the plurality of optical modulators. The apparatus also includes at least one of a wavelength division multiplexer beam combiner, a polarization division multiplexer beam combiner, and/or a time division multiplexer beam combiner operable to communicate with the plurality of optical modulators. Optionally, the apparatus further includes a pulsed laser; and a beam divider operable to communicate with the plurality of optical modulators and with the pulsed laser. Optionally, the apparatus further includes a pulsed laser with a plurality of outputs operable to communicate with said plurality of optical modulators. Optionally, the apparatus further includes a plurality of pulsed lasers operable to communicate with a plurality of optical modulators. Optionally, the apparatus further includes a photodetector operable to communicate with the beam combiner. Optionally, the apparatus further includes a low pass filter operable to communicate with the photodetector. Optionally, the apparatus further includes a band pass filter operable to communicate with the beam combiner. Optionally, the apparatus further includes a photodetector operable to communicate with the band pass filter. Optionally, the apparatus further includes a plurality of photodetectors operable to communicate with the at least one of a wavelength division multiplexer beam combiner, a polarization division multiplexer beam combiner, and a time division multiplexer beam combiner. Optionally, the apparatus further includes a combiner operable to communicate with the plurality of photodetectors. Optionally, the apparatus further includes a low pass filter operable to communicate with the combiner.

Another embodiment of the invention includes an apparatus receiving a digital signal having a plurality of significant bits of resolution. The apparatus includes a plurality of optical modulators. The apparatus also includes a digital waveform source operable to output a plurality of signals corresponding to the plurality of significant bits of resolution, the plurality of signals operable to drive said plurality of optical modulators. The apparatus also includes a plurality of photodetectors operable to communicate with said plurality of optical modulators.

An embodiment of the instant invention optionally includes an elegantly simple, compact design for a photonic digital-to-analog converter.

An embodiment of the instant invention optionally facilitates operation at higher speeds than existing digital-to-analog converters.

An embodiment of the instant invention optionally facilitates incoherent summing of modulator outputs in single-mode filter, which allows for high resolution while maintaining operation speed by utilizing conventional high-speed photodetectors.

DESCRIPTION OF THE PREFERRED EMBODIMENTS

Figure 1:
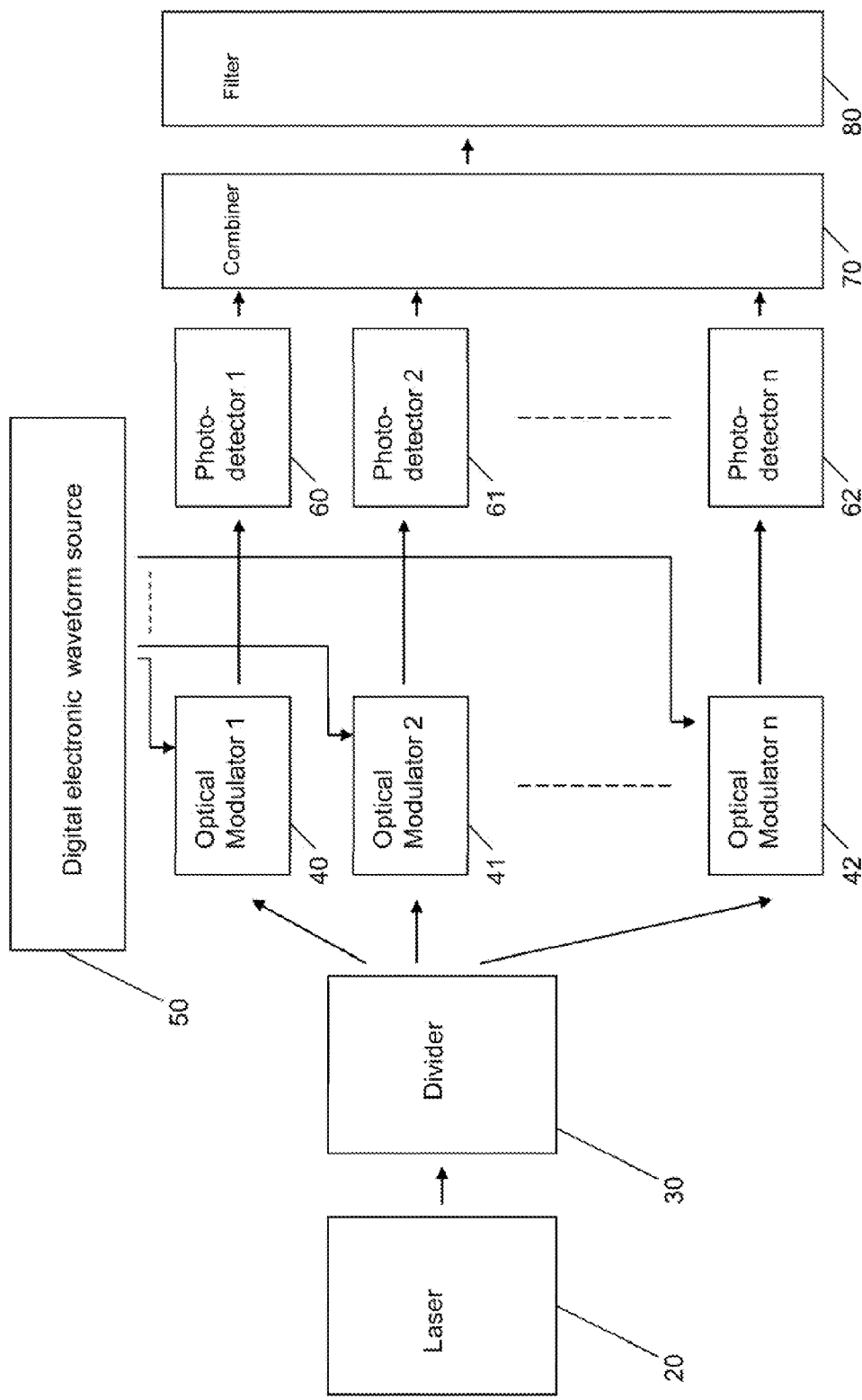
FIG. 1 is a block diagram of an apparatus embodiment of the invention.

An embodiment of the invention is described as follows with respect to FIG. 1. The embodiment includes a laser 20, which communicates with a divider or splitter 30. For example, laser 20 includes a mode-locked fiber laser operating at a 1547-nm wavelength with a 1-GHz repetition rate, as a source. The divider 30 splits the laser light into n beams corresponding to n optical modulators 40, 41, 42. For example, divider 30 for a two-bit signal includes a 70/30 splitter. For example, wherein n equals two, the optical modulators include two 10-Gb/s modulators. The optical modulators 40, 41, 42 communicate with a digital electronic waveform source 50. For example, the digital electronic waveform source 50 includes an Anritsu pulse pattern generator driven synchronously with the fiber laser's clock. The digital electronic waveform source 50 generates n signals corresponding to n significant bits of resolution, the signals driving the optical modulators 40, 41, 42. Each optical modulator receives a respective signal corresponding to a respective significant bit of resolution. The n optical modulators 40, 41, 42 communicate with n photodetectors 60, 61, 62, which in turn communicate with a combiner 70, as shown in FIG. 1. The combiner 70 in turn communicates with a filter 80. For an n-bit signal, an n-to-1 combiner is optionally used. For example, combiner 70 that combines the optical outputs of the two optical modulators shown in FIG. 4 includes a 50/50 combiner. In another example, the combiner 70 is optionally replaced with a low-loss directional coupler.

Figure 2:
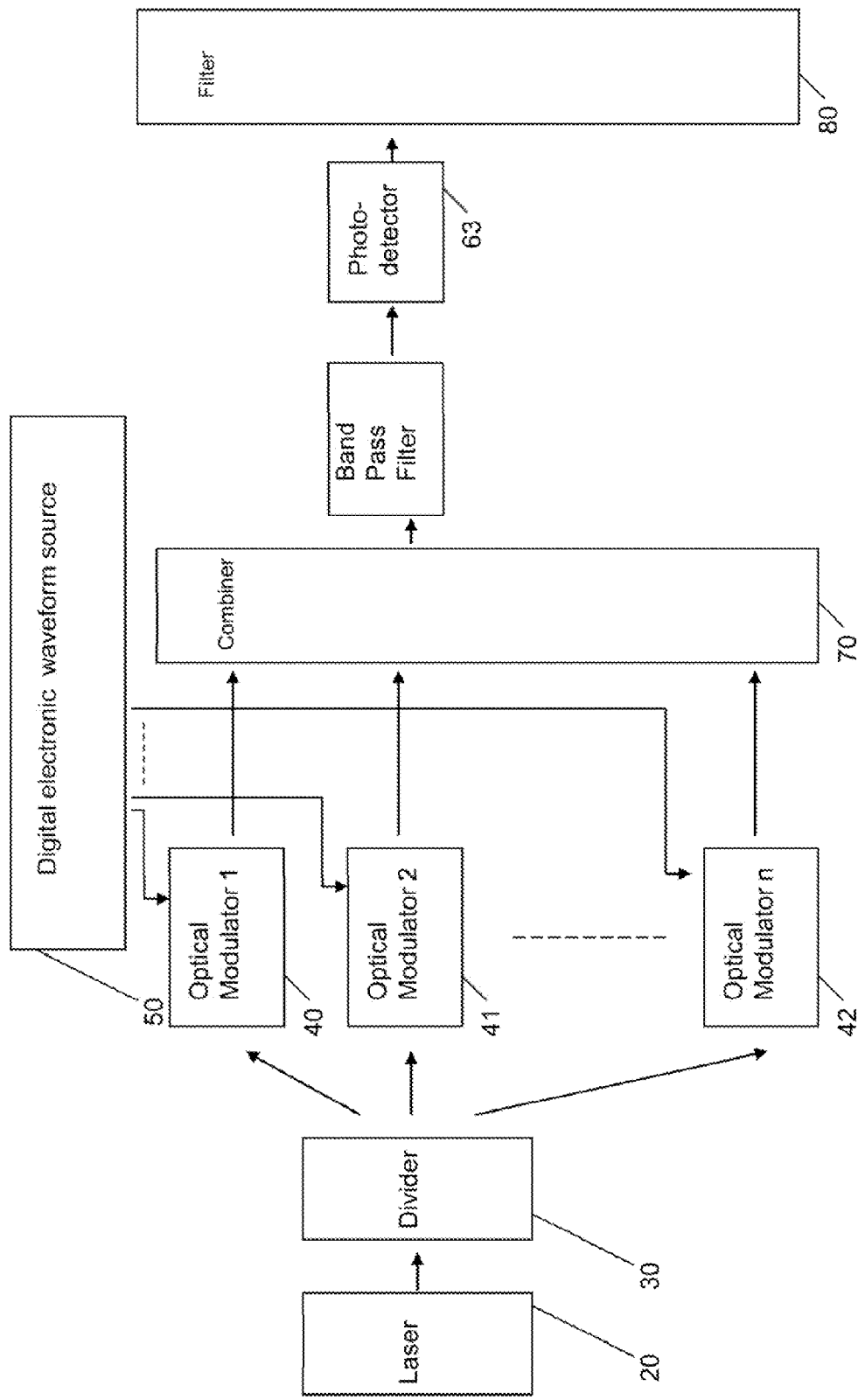
FIG. 2 is a block diagram of another apparatus embodiment of the invention.

Alternatively, the n optical modulators 40, 41, 42 communicate with the combiner 70, which in turn communicates with a photodetector 63, as shown in FIG. 2. Optionally, the optical encoded data signal is combined in a time-division-multiplexing, wavelength-division-multiplexing, and/or polarization-division-multiplexing geometry.

Figure 3:
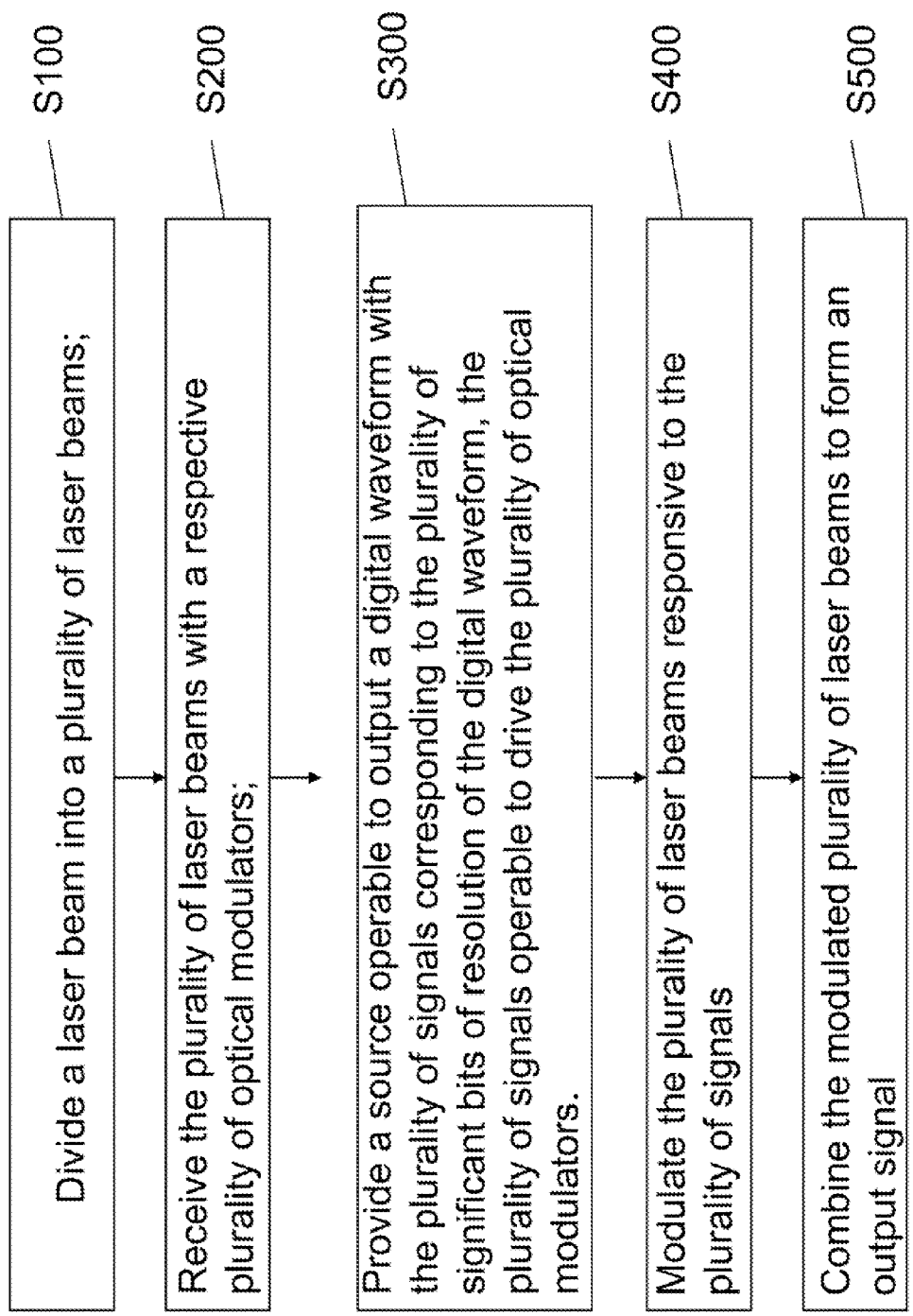
FIG. 3 is a flowchart of a method embodiment of the invention.

Another embodiment of the invention is described as follows, referring to FIG. 3. In Step S100, a laser beam is divided into a plurality of laser beams. In Step S200, the plurality of laser beams is received with a respective plurality of optical modulators. In Step S300, a source is provided, which source is operable to output a digital waveform with the plurality of signals corresponding to the plurality of significant bits of resolution of the digital waveform, the plurality of signals being operable to drive the plurality of optical modulators. In Step S400, the plurality of laser beams is modulated responsive to the plurality of signals. In Step S500, the modulated plurality of laser beams is combined to form an output signal.

Another embodiment of the invention includes a weighted, summing photonic digital-to-analog converter method and apparatus using a mode-locked laser source that is split, modified, and recombined using single-mode fiber through a combination of time, polarization, and wavelength multiplexing. The analog output is achieved by low-pass filtering of the recombined laser pulses. A 1-GSPS converter is demonstrated with a resolution of 2 bits.

Figure 4:
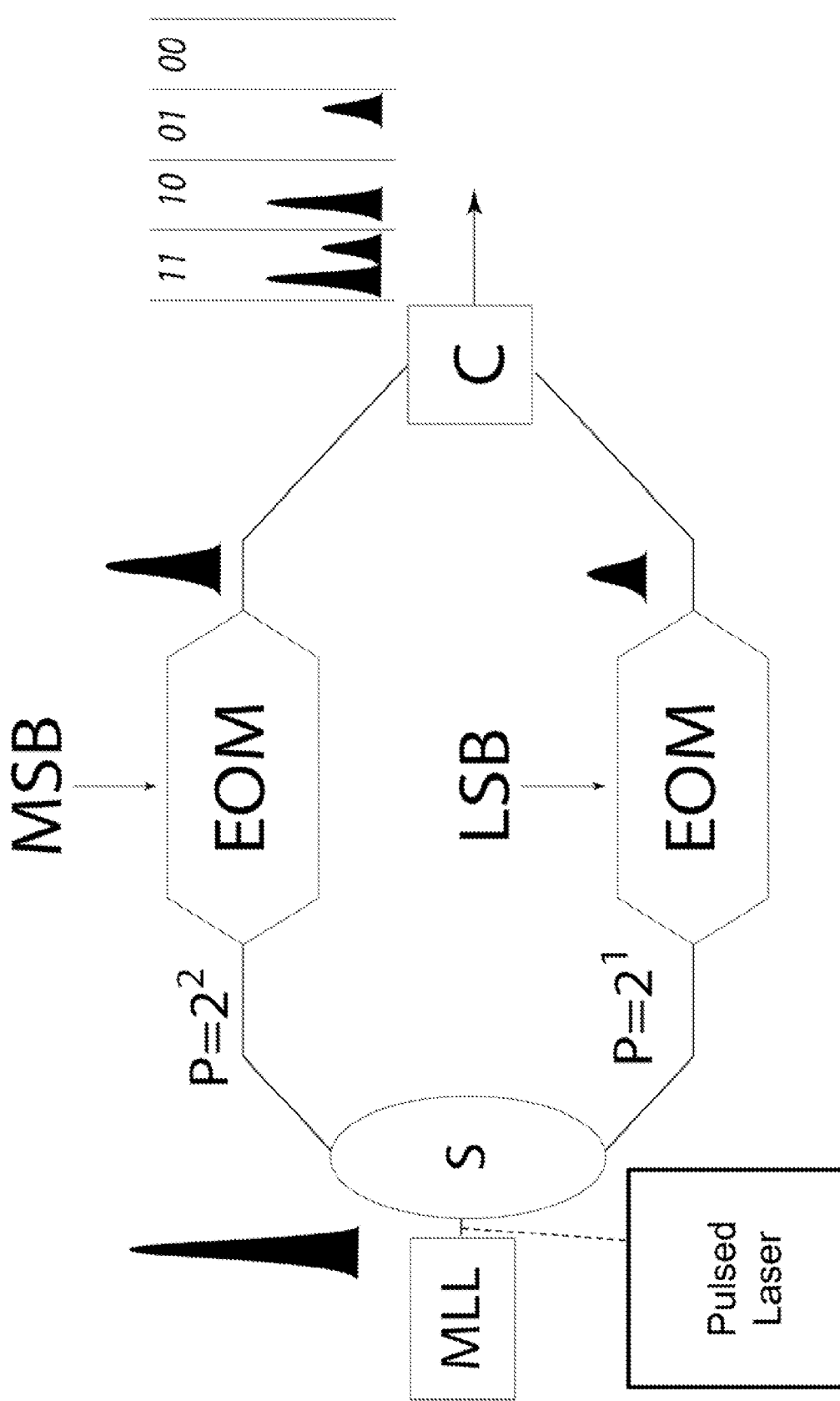
FIG. 4 is a block diagram of another apparatus embodiment of the invention.

Electronic systems have paved the way with years of DAC technology. The instant invention extends the standard electronic weighted, summing DAC technique into the photonic domain. According to an embodiment of the invention, a mode-locked laser is used as the clock source for our data and its output is unequally divided to drive N electrooptic (EO) modulators. The splitting of the laser power is weighted in a $2N$ fashion, characteristic of a weighted summing DAC where N is the number of bits of resolution of the digital signal. The modulators are used as digital switches either passing or blocking the mode locked laser pulse. Each modulator is driven by one bit of the digital data: the most-significant bit (MSB) drives the EO modulator in the path with the most optical power ($2N$), while the least-significant bit (LSB) drives the EO modulator in the path with the least optical power ($21$). The laser paths are then combined and form the sampled analog output. This output optical signal is then low-pass filtered to satisfy Nyquist criterion, thus, generating an analog output waveform from the digital input data. An example of 2-bit system is shown in FIG. 4. Alternate embodiments of the invention include N-bit systems, where N is greater than two.

Several standard optical methods can be used for splitting and combining the laser output. Polarization, time, and wavelength division multiplexing are illustrative techniques that allow for incoherent summing of the EO modulator outputs. Performing these multiplexing operations in single-mode fiber removes potential high-speed conversion bottlenecks inherent in multimode fiber and large area photodetectors, such as discussed in Saida, T., Okamoto, K., Uchiyama, K., Takiguchi, K., Shibata, T., and Sugita, A., 'Integrated optical digital-to-analogue converter and its application to pulse pattern recognition.' Electron, Lett., 37, pp. 1237-1238, 2001, incorporated herein by reference, and Yacoubian, A. and Das, P. K., 'Digital-to-analog conversion using electrooptic modulators.' IEEE Photon. Technol. Lett., 15, pp. 117-119, 2003, incorporated herein by reference.

Mode-locked laser pulses are much faster than electronic digital data pulses, thereby providing accurate sampling of the digital data as well as providing room for time multiplexing. In addition, these lasers are very stable optical clocks that can be used as a system clock or synchronized with the existing data clock.

Figure 5:
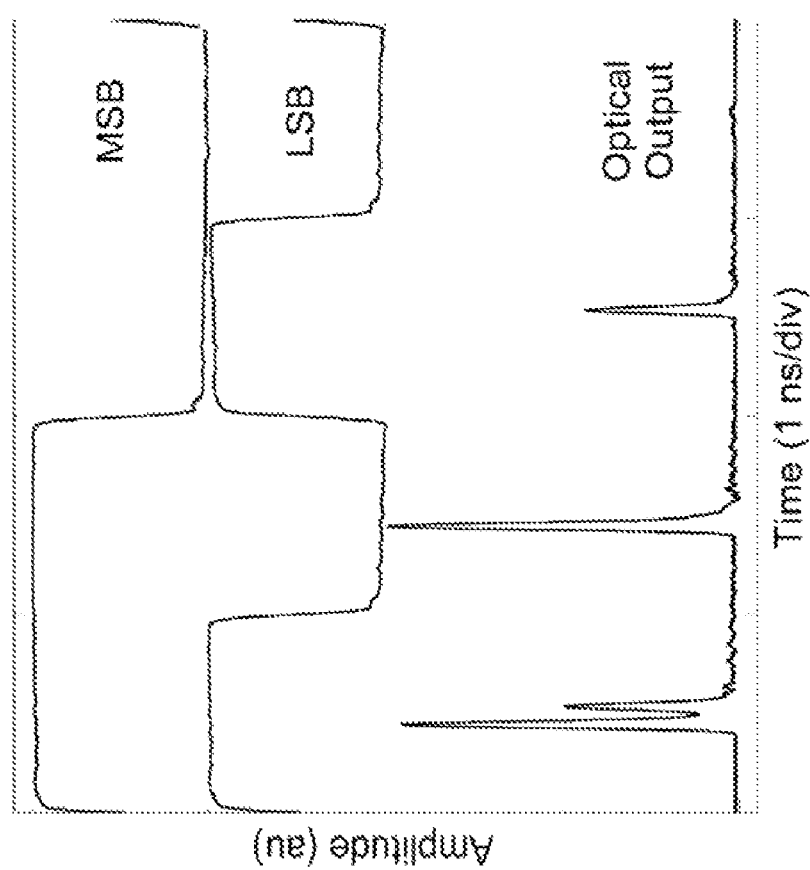
FIG. 5 is a graph of illustrative digital inputs and optical outputs of an embodiment of the invention.

FIG. 5 shows an illustrative digital input to each modulator and an illustrative output of the optical system. The time delay between the two optical paths is, for example, set at ~80 ps. well within the 1-ns timing width, in order to observe the distinct output pulses in FIG. 5 with 12+GHz bandwidth limited optical receiver on an oscilloscope. In an alternative implementation, it is sufficient to delay the optical pulses in time only long enough to avoid coherent interaction effects.

Figure 6:
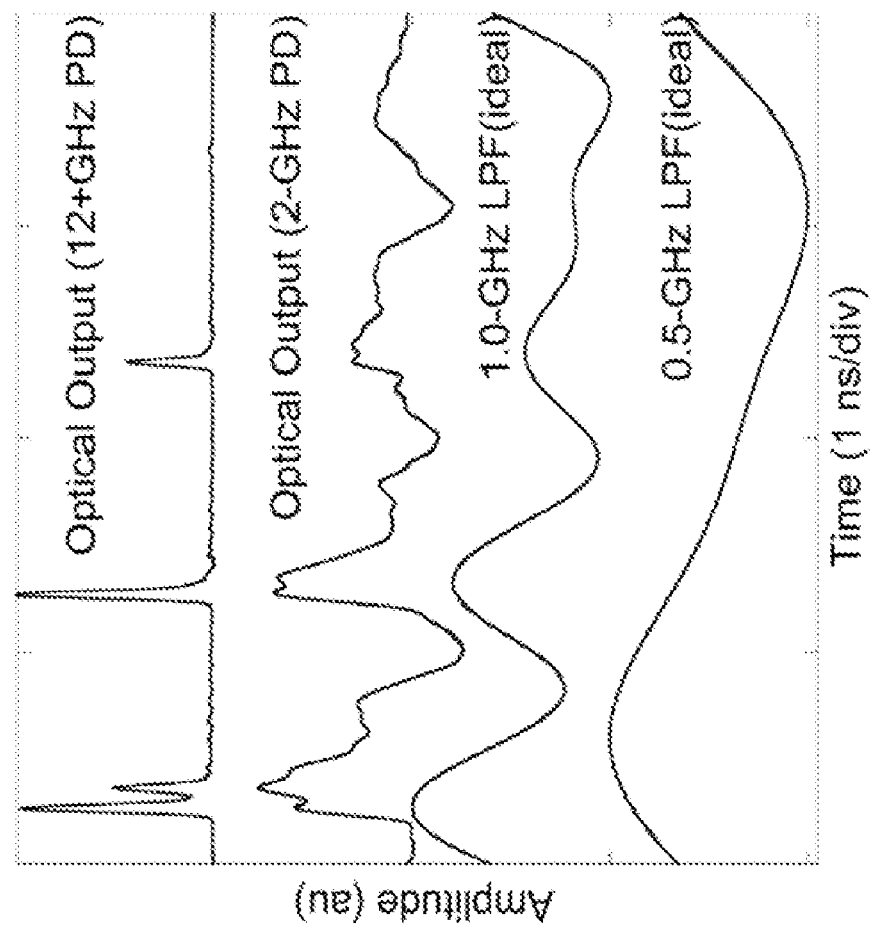
FIG. 6 is a graph of an optical output processed by a filter according to an embodiment of the invention.

The optical output passes through a Nyquist filter to finalize the photonic DAC according to an embodiment of the invention. FIG. 6 shows an illustrative optical output detected with, for example, a 12+GHz optical receiver and, for example, a 2-GHz optical receiver. These data demonstrate filtering above the Nyquist criterion—0.5 GHz for this 1-GSPS photonic DAC. The data from the 12+GHz optical receiver is digitally post-processed with, for example, 1.0- and 0.5-GHz low-pass filters. The results shown in FIG. 6 demonstrate that with a proper Nyquist filter, an analog sawtooth waveform is produced from the monotonically decreasing digital data.

The filtered output demonstrates the viability of this method for converting high-speed digital data into an analog waveform. For example, multi-wavelength optical clocks such as discussed in Lou, J. W., Carruthers, T. F., and Currie, M., '4×10 GHz mode-locked multiple-wavelength fiber laser,' IEEE Photon. Technol. Lett. 16, pp. 51-53, 2004, incorporated herein by reference. EO modulators and digital data are available with speeds in excess of 10 GHz. Thus, the conversion rate of an embodiment of this method of photonic DAC can be increased more than 10 fold. An embodiment of this method of incoherent summing of the EO modulator outputs in single-mode fiber allows for >8-bits of resolution, while maintaining operation speed by utilizing conventional high-speed photodetectors. In addition, current photonic technology optionally allows implementing an embodiment of this photonic DAC system in a single, opto-electronic integrated circuit package.

Alternatively, instead of a mode-locked laser, a continuous wave (CW) or pulsed laser is optionally used in the system.

Optionally, examples of optical modulators according to alternative embodiments of the invention include electro-optic modulators, electro-absorption modulators, acousto-optic modulators, thermo-optic modulators, and/or magneto-optic modulators.

Optionally, instead of a pulse pattern generator, alternative embodiments of the invention include any digital signal source.

Optionally, instead of combining the optical encoded data signal using a time-division-multiplexing geometry, alternative embodiments of the invention include wavelength-division-multiplexing, and/or polarization-division-multiplexing.

Optionally, the summing schemes are based upon a variety of incoherent summing methods such as time-division multiplexing, wavelength-division multiplexing, and/or polarization-division multiplexing.

Optionally, the electro-optical modulators vary amplitude in a linear fashion instead of acting as only a digital switch. The linear variation relates to the 2N weighting.

Obviously, many modifications and variations of the instant invention are possible in light of the above teachings. It is therefore to be understood that the scope of the invention should be determined by referring to the following appended claims.

What is claimed is:

1. An apparatus receiving a digital signal waveform having a plurality of significant bits of resolution, comprising:
   a mode locked laser comprising a single output synchronous with the digital signal waveform;
   a beam divider operable to receive the single output;
   a plurality of optical amplitude modulators operable to communicate with said beam divider and operable to receive a respective plurality of signals corresponding to a plurality of significant bits of resolution of the digital signal waveform; and
   a low pass filter operable to communicate with said plurality of optical modulators and operable to output an analog output waveform representing the digital signal waveform having the plurality of significant bits of resolution.

2. The apparatus according to claim 1, further comprising:
   a source operable to output the digital signal waveform with the plurality of signals corresponding to the plurality of significant bits of resolution of the digital waveform, the plurality of signals operable to drive said plurality of optical modulators.

3. The apparatus according to claim 1, further comprising:
   a beam combiner operable to communicate with said plurality of optical modulators.

4. The apparatus according to claim 3, further comprising:
   a photodetector operable to communicate with said beam combiner; and wherein the filter comprises a low pass filter operable to communicate with said photodetector.

5. An apparatus receiving a digital signal waveform having a plurality of significant bits of resolution, comprising:
   a mode locked laser comprising a single output synchronous with the digital signal waveform;
   a beam divider operable to receive the single output;
   a plurality of optical amplitude modulators operable to communicate with said beam divider and operable to receive a respective plurality of signals corresponding to a plurality of significant bits of resolution of the digital signal waveform;
   a beam combiner operable to communicate with said plurality of optical modulators, and a band pass filter operable to communicate with said beam combiner; and
   a photodetector operable to communicate with said band pass filter and operable to output an analog output waveform representing the digital signal waveform having the plurality of significant bits of resolution.

6. The apparatus according to claim 1, further comprising:
   a plurality of photodetectors operable to communicate with said plurality of optical modulators;
   a combiner operable to communicate with the plurality of photodetectors; and
   a low pass filter operable to communicate with said combiner.

7. An apparatus receiving a digital signal waveform having a plurality of significant bits of resolution, comprising:
   one of a pulsed laser with a plurality of pulsed laser outputs synchronous with the digital signal waveform and a plurality of pulsed lasers;
   a beam divider operable to communicate with said one of a pulsed laser with a plurality of pulsed laser outputs and a plurality of pulsed lasers;
   a plurality of optical amplitude modulators operable to communicate with said beam divider and operable to receive a respective plurality of signals corresponding to a plurality of significant bits of resolution of the digital signal waveform; and
   a low pass filter operable to communicate with said plurality of optical modulators and operable to output an analog output waveform representing the digital signal waveform having the plurality of significant bits of resolution.

8. An apparatus receiving a digital signal waveform having a plurality of significant bits of resolution, comprising:

one of a pulsed laser with a plurality of pulsed laser outputs synchronous with the digital signal waveform and a plurality of pulsed lasers;

a beam divider operable to communicate with said one of a pulsed laser with a plurality of pulsed laser outputs and a plurality of pulsed lasers;

a plurality of optical amplitude modulators operable to communicate with said beam divider and operable to receive a respective plurality of signals corresponding to a plurality of significant bits of resolution of the digital signal waveform;

a beam combiner operable to communicate with said plurality of optical modulators, and a band pass filter operable to communicate with said beam combiner; and a photodetector operable to communicate with said band pass filter and operable to output an analog output waveform representing the digital signal waveform having the plurality of significant bits of resolution.

\* \* \* \* \*

UNITED STATES PATENT AND TRADEMARK OFFICE
CERTIFICATE OF CORRECTION

| | | |
|---|---|---|
| PATENT NO. | : 8,009,995 B2 | Page 1 of 1 |
| APPLICATION NO. | : 11/535724 | |
| DATED | : August 30, 2011 | |
| INVENTOR(S) | : Marc Currie et al. | |

It is certified that error appears in the above-identified patent and that said Letters Patent is hereby corrected as shown below:

On the title page items 12 and 75

**Please correct the order of the inventors name; the Given Name should be listed first and the Family Name listed last. It should be as follows:

Marc Currie
Janet W. Lou

Signed and Sealed this
Eleventh Day of June, 2013

Teresa Stanek Rea
*Acting Director of the United States Patent and Trademark Office*